(12) United States Patent  
Choi et al.

(10) Patent No.: US 11,753,715 B2  
(45) Date of Patent: Sep. 12, 2023

(54) APPARATUS AND METHODS FOR CONTROLLING CONCENTRATION OF PRECURSORS TO PROCESSING CHAMBER

(71) Applicant: Applied Materials, Inc., Santa Clara, CA (US)

(72) Inventors: Kenric Choi, San Jose, CA (US); William J. Durand, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 329 days.

(21) Appl. No.: 16/893,679

(22) Filed: Jun. 5, 2020

(65) Prior Publication Data

US 2021/0381104 A1 Dec. 9, 2021

(51) Int. Cl.
| | |
|---|---|
| *C23C 16/00* | (2006.01) |
| *C23C 16/448* | (2006.01) |
| *C23C 16/455* | (2006.01) |
| *B01F 35/20* | (2022.01) |

(52) U.S. Cl.
CPC .......... *C23C 16/4482* (2013.01); *B01F 35/20* (2022.01); *C23C 16/45553* (2013.01); *C23C 16/45561* (2013.01); *C23C 16/45589* (2013.01)

(58) Field of Classification Search
CPC ............ C23C 16/4402; C23C 16/4482; C23C 16/52

See application file for complete search history.

(56) References Cited

U.S. PATENT DOCUMENTS

| | | | | |
|---|---|---|---|---|
| 5,451,258 A | * | 9/1995 | Hillman | .............. C23C 16/4485 118/724 |
| 5,551,477 A | * | 9/1996 | Kanno | ................ F16K 37/0058 137/553 |
| 7,827,932 B2 | * | 11/2010 | Kojima | ................... C23C 16/18 118/723 VE |
| 8,927,066 B2 | | 1/2015 | Ye et al. | |
| 9,200,367 B2 | | 12/2015 | Ye et al. | |
| 9,488,315 B2 | | 11/2016 | Nangoy et al. | |
| 2017/0211717 A1 | | 7/2017 | Gamache | |
| 2018/0179628 A1 | * | 6/2018 | Hashimoto | ......... C23C 16/4482 |

* cited by examiner

*Primary Examiner* — Anshu Bhatia

(74) *Attorney, Agent, or Firm* — Servilla Whitney LLC

(57) ABSTRACT

Apparatus and methods for supplying a vapor to a processing chamber are described. The vapor delivery apparatus comprises an inlet conduit and an outlet conduit, each with two valves, in fluid communication with an ampoule. A bypass conduit connects the inlet conduit and the outlet conduit. A flow restrictive device restricts flow through the outlet conduit.

20 Claims, 12 Drawing Sheets

APPARATUS AND METHODS FOR CONTROLLING CONCENTRATION OF PRECURSORS TO PROCESSING CHAMBER

FIELD

The disclosure pertains to apparatus and methods for delivering precursors to a processing chamber. More specifically, embodiments of the disclosure are directed to apparatus and methods for delivering precursors with improved removal of residual concentration control to the processing chamber.

BACKGROUND

Precursor vapor (e.g., metal-organic precursor vapor) is commonly used for film deposition processes including the thermal deposition of one or more precursor vapors in a processing chamber. Precursors such as metal-organic precursors are usually in liquid or solid form. Precursor vapor is usually generated thermally inside a closed container or ampoule. Molecules of the precursor are then delivered to a substrate surface inside the processing chamber through a gas delivery gas conduit. To prevent the vapor reverting back to its bulk form, the gas delivery conduit is usually thermally controlled to be above the dew point of the particular precursor.

An inert gas is usually used to carry the precursor vapor along the gas delivery gas conduit. The carrier gas typically increases the partial pressure of the precursor due to agitation of gas flow into the container and dilutes the precursor inside the gas, adjusting the total precursor concentration.

Ampoule headspace pressure is a primary contributor towards the transport kinetics of the precursor. Variability in the ampoule headspace pressure yields variability in the concentration of precursor vapors delivered from the ampoule to the processing chamber. In a dynamic flowing system, the headspace pressure is determined by the gas flow rates, the conductance of the system, and the upstream/downstream pressures. Therefore, there is a need for apparatus and methods to provide improved concentration control of precursors delivered to processing chambers.

SUMMARY

One or more embodiments of the disclosure are directed to an apparatus comprising an ampoule having an outside surface and an inside surface defining an ampoule interior configured to contain a fluid therein; a valve cluster connected to the outside surface of the ampoule, the valve cluster including: an inlet conduit connected to the ampoule and configured to allow gas to flow into the ampoule; an outlet conduit connected to the ampoule and configured to allow gas to flow out of the ampoule; a first inlet valve connected to the inlet conduit; a second inlet valve connected to the inlet conduit and upstream of the first inlet valve; a first outlet valve connected to the outlet conduit; a second outlet valve connected to the outlet conduit and downstream of the first outlet valve; and a bypass conduit including a bypass valve disposed between the inlet conduit and the outlet conduit. The apparatus further comprises an auxiliary flow restrictive device connected to the outlet conduit, the auxiliary flow restrictive device configured to variably regulate a drop in pressure from the inlet conduit to the outlet conduit.

Additional embodiments of the disclosure are directed to an apparatus comprising an ampoule having an outside surface and an inside surface defining an ampoule interior configured to contain a fluid therein; a valve cluster connected to the outside surface of the ampoule, the valve cluster configured to regulate the flow of a precursor vapor from the ampoule to a processing chamber, the valve cluster including: an inlet conduit connected to the ampoule and configured to allow gas to flow into the ampoule; an outlet conduit connected to the ampoule and configured to allow gas to flow out of the ampoule and to the processing chamber; a first inlet valve connected to the inlet conduit; a second inlet valve connected to the inlet conduit and upstream of the first inlet valve; a first outlet valve connected to the outlet conduit; a second outlet valve connected to the outlet conduit and downstream of the first outlet valve comprising a piston and a diaphragm which regulate the flow of gas through the second outlet valve; and a bypass conduit including a bypass valve disposed between the inlet conduit and the outlet conduit. The apparatus further comprises an auxiliary flow restrictive device connected to the outlet conduit, the auxiliary flow restrictive device configured to variably regulate a concentration of the precursor flowing out of the outlet conduit and to the processing chamber.

Further embodiments of the disclosure are directed to a method of delivering a precursor to a substrate processing chamber, the method comprising flowing a carrier gas through an ampoule having an interior volume containing a liquid precursor defining a liquid level surface, the carrier gas flowing through a valve stack including: an inlet conduit connected to the ampoule and configured to allow gas to flow into the ampoule, the inlet conduit including a first inlet valve connected to the inlet conduit and a second inlet valve connected to the inlet conduit and upstream of the first inlet valve; an outlet conduit connected to the ampoule and configured to allow the carrier gas and precursor vapor to flow out of the ampoule, the outlet conduit including a first outlet valve connected to the outlet conduit and a second outlet valve connected to the outlet conduit and downstream of the first outlet valve; and a bypass conduit including a bypass valve disposed between the inlet conduit and the outlet conduit, the second outlet valve comprising a piston and a diaphragm which regulate flow of gas through the second outlet valve. The method further comprises restricting the flow through the outlet conduit with an auxiliary flow restrictive device.

BRIEF DESCRIPTION OF THE DRAWINGS

So that the manner in which the exemplary embodiments of the present invention are attained and can be understood in detail, a more particular description of the disclosure, briefly summarized above, may be had by reference to the embodiments thereof which are illustrated in the appended drawings. It is to be appreciated that certain well known processes are not discussed herein in order to not obscure the invention.

DETAILED DESCRIPTION

Figure 1A:
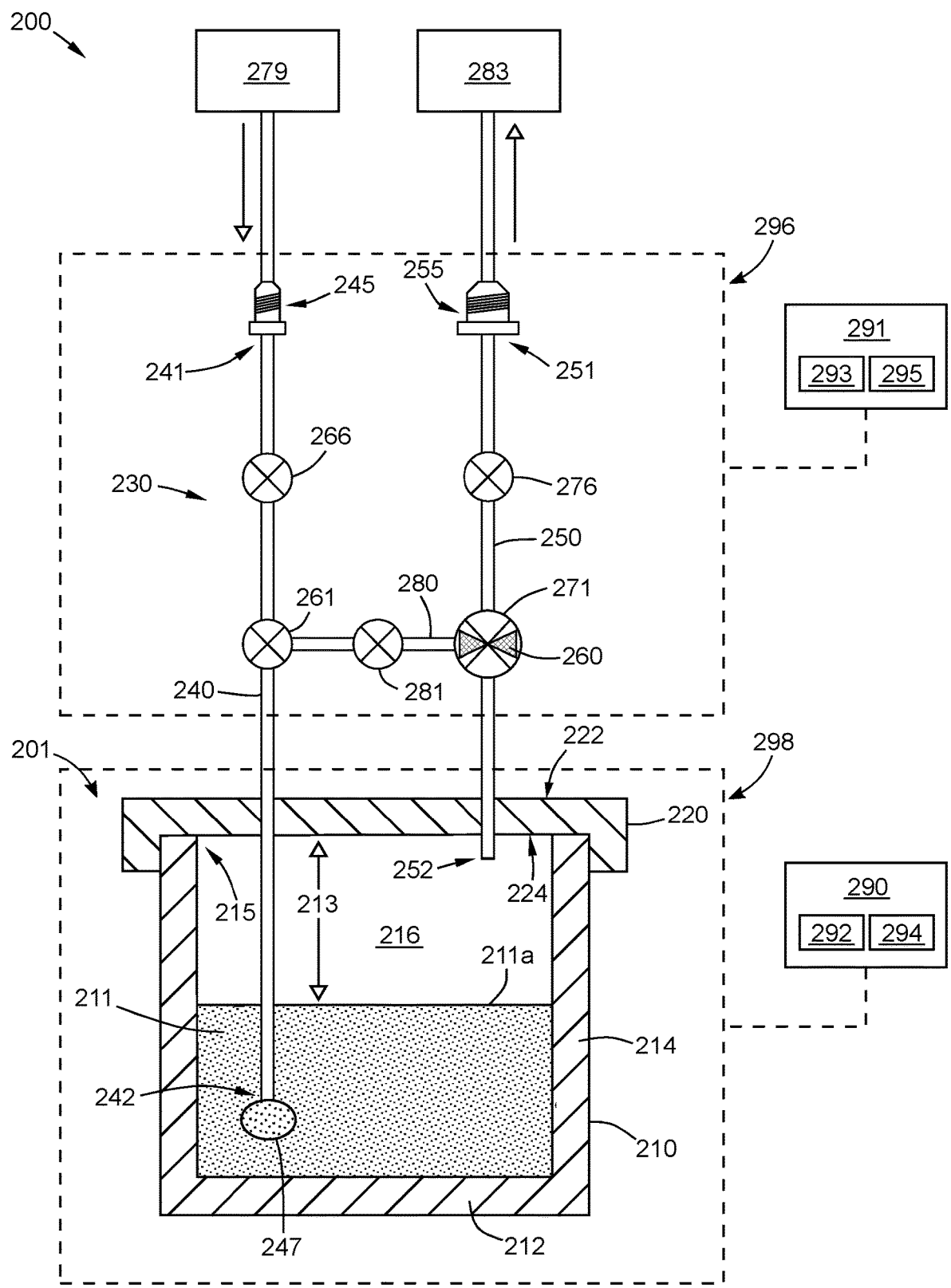
FIG. 1A shows a schematic of an apparatus in accordance with one or more embodiments of the disclosure.

One or more embodiments of the disclosure provide apparatus and methods for providing accurate concentration control delivery of precursors to processing chambers.

FIGS. 1A-H shows an apparatus 200 which can be used for the delivering vapor precursors to a substrate processing chamber according to one or more embodiments of the disclosure. The apparatus 200 includes a closed container or ampoule 201. While the ampoule 201 shown includes an ampoule base 210, an ampoule lid 220 and a valve cluster 230, those skilled in the art will understand that the disclosure is not limited to the configuration shown. Some embodiments of the disclosure are directed to an ampoule 201 with a valve cluster 230 attached or connected to the ampoule 201. For example, in some embodiments, the valve cluster 230 can be retrofit onto an existing ampoule base 210. Some embodiments are directed to an apparatus or a method that include a valve cluster 230 that is configured to be retrofit onto an existing ampoule lid 220.

The ampoule base 210 has a bottom 212 with a sidewall 214 extending from the bottom 212 defining an interior volume 216 configured to contain a liquid precursor 211 defining a liquid level surface 211a, which is the top of the liquid precursor 211 in the ampoule 201. The bottom 212 and the sidewall 214 in some embodiments are configured to be integrally formed as a single component, or in other embodiments, are configured as multiple components joined together. In some embodiments, the ampoule base 210 is a single component formed into a cup-like shape so that the sidewall 214 and bottom 212 form the interior volume 216 of the ampoule 201, which is configured to contain the liquid precursor 211 and includes a headspace 213 above the liquid level surface 211a. It will be appreciated that the liquid level surface 211a can decrease as liquid precursor 211 is used during a manufacturing process, and the headspace 213 increases in volume as the liquid level decreases.

In the embodiments shown, the ampoule lid 220 is positioned at a top end 215 of the sidewall 214 of the ampoule base 210. The ampoule lid 220 in some embodiments is configured to be attached to the ampoule base 210 by any suitable connections including, but not limited to, welding, friction fit, bolts between a flange (not shown) on each of the ampoule lid 220 and base 210.

The ampoule lid 220 has an outside surface 222 and an inside surface 224. When connected to the top end 215 of the sidewall 214, the ampoule lid 220 encloses the interior volume 216 of the ampoule 201.

An inlet conduit 240 is in fluid communication with the interior volume 216 of the ampoule 201. The inlet conduit 240 has an outside end 241 located on the outside of the ampoule 201. Stated differently, the outside end 241 is on the side of the ampoule lid 220 with the outside surface 222. The inlet conduit 240 has an inside end 242 located within the interior volume 216 of the ampoule 201. In an embodiment in which there is no ampoule base 210, the inside end 242 of the inlet conduit 240 is on the side of the ampoule lid 220 with the inside surface 224.

The inside end 242 of the inlet conduit 240 in some embodiments is configured to be flush with the inside surface 224 of the ampoule lid 220. In the embodiments shown in FIGS. 1A-H, the inside end 242 of the inlet conduit 240 extends a distance from the inside surface 224 of the ampoule lid 220. In some embodiments, the distance that the inlet conduit 240 extends from the inside surface 224 of the ampoule lid 220 is sufficient to bring the inside end 242 of the inlet conduit 240 to a distance in the range of about 10 mm to about 100 mm from the bottom 212 of the ampoule base 210. In some embodiments, the inside end 242 of the inlet conduit is submerged in the liquid precursor 211 during processing of a substrate in which precursor vapor is delivered to a processing chamber 283 during a film formation process. In other embodiments, the inside end 242 of the inlet conduit is not submerged in the liquid precursor 211 during processing of a substrate in which precursor vapor is delivered to a processing chamber 283 during a film formation process. In other words, the inside end 242 of the inlet conduit is in the headspace 213 during a film formation process.

In some embodiments, an inlet disconnect 245 is located at the outside end 241 of the inlet conduit 240. The inlet disconnect 245 can be any component that allows the inlet conduit 240 to be connected to and disconnected to another component, for example, a gas supply 279. For example, the inlet disconnect 245 can be a coupling with screw threads to allow the inlet disconnect 245 to be screwed into a receiving nut (not shown). The inlet disconnect 245 is in fluid communication with the inlet conduit 240 so that a fluid such as a gas from the gas supply can flow through the outside end 241 of the inlet conduit 240. While not shown, the apparatus can utilized a mass flow controller or a volume flow controller to regulate the flow of the gas from the gas supply 279 to the inlet conduit 240.

In some embodiments, the inside end 242 of the inlet conduit 240 has a component to redirect or diffuse the flow of gas through the inlet conduit 240. In some embodiments, a sparger 247 is positioned on the inside end 242 of the inlet conduit 240. The sparger 247 is in fluid communication with the inlet conduit 240 to allow a gas flowing through the inlet conduit 240 to pass through the sparger 247 to bubble through the liquid precursor 211.

In some embodiments, the inside end 242 of the inlet conduit 240 is above the liquid level surface 211a of liquid precursor 211. In one or more embodiments, the inside end 242 of the inlet conduit 240 and the inside end 252 of the outlet conduit 250 do not contact the liquid precursor 211. In an embodiment of this sort, the precursor vapor in the headspace 213 above the liquid precursor 211 is carried through the outlet conduit 250 to the processing chamber 283.

An outlet conduit 250 is in fluid communication with the interior volume 216 of the ampoule 201. The outlet conduit 250 has an outside end 251 located on the outside of the ampoule 201. In an embodiment in which there is no ampoule base 210, the outside end 251 is located on the outside surface 222 side of the ampoule lid 220. The outlet conduit 250 has an inside end 252 which, in the embodiments shown in FIGS. 1A-H, can be located within the interior volume 216 of the ampoule 201. In an embodiment in which there is no ampoule base 210, the inside end 252 of the outlet conduit is on the inside surface 224 side of the ampoule lid 220.

In one or more embodiments, the inside end 252 of the outlet conduit 250 can be flush with the inside surface 224 of the ampoule lid 220. In the embodiments shown in FIGS. 1A-H, the inside end 252 extends a distance from the inside surface 224. Stated differently, the outlet conduit 250 extends a distance from the inside surface 224 of the ampoule lid 220 so that the inside end 252 is a distance within the interior volume 216 of the ampoule 201. The distance that the inside end 252 extends from the inside surface 224 can vary in the range of about flush with the inside surface 224 to 50 mm. In some embodiments, the inside end 252 extends from the inside surface 224 by an amount less than or equal to about 40 mm, 30 mm, 20 mm or 10 mm. In some embodiments, the inside end 252 of the outlet conduit 250 is at least about 1 mm from the inside surface 224 so that the inside end 252 is not flush with the inside surface 224. In some embodiments, the inside end 252 extends from the inside surface 224 by an amount in the range of about 1 mm to about 40 mm, or about 2 mm to about 35 mm, or about 3 mm to about 30 mm, or about 4 mm to about 25 mm, or about 5 mm to about 20 mm.

In an embodiment, the inside end 252 of the inlet conduit 240 does not extend far enough from the inside surface 224 of the ampoule lid 220 to contact the precursor liquid 211. In one or more embodiments, the inside end 252 of the outlet conduit 250 sticks out from the inside surface 224 of the ampoule lid 220 a small amount toward the liquid precursor 211. The edge of the inside end 252 may reduce condensed liquid or splashed liquid from entering the outlet conduit 250. The inside end 252 of the outlet conduit 250 does not extend into the interior volume 216 far enough to reduce the amount of precursor being delivered.

In some embodiments, the outlet conduit 250 includes an outlet disconnect 255 at an outside end 251. The outlet disconnect 255 is in fluid communication with the outlet conduit 250 so that a fluid such as a vapor entrained in a gas from the ampoule 201 flowing through the outlet conduit 250 can pass through the outlet disconnect 255. The outlet disconnect 255 can be any component that allows the outlet conduit 250 to be connected to and disconnected from. For example, the outlet disconnect 255 can be a coupling with screw threads to allow the outlet disconnect 255 to be screwed into a receiving nut (not shown). The outlet disconnect 255 can be the same style or size as the inlet disconnect 245. In some embodiments, the inlet disconnect 245 and the outlet disconnect 255 are different sizes so that the inlet conduit 240 and outlet conduit 250 can be easily distinguished. In the embodiments shown, the outlet disconnect 255 is connected to a processing chamber into which precursor vapor entrained in a carrier gas is delivered for film deposition process. The processing chamber can be an atomic layer deposition chamber, a chemical vapor deposition chamber or a plasma enhanced chemical vapor deposition chamber.

Some embodiments include a splash guard (not shown). The splash guard can be connected to the inside surface 224 of the ampoule lid 220 or to the sidewall 214 of the ampoule base 210. The inside end 252 of the outlet conduit 250 can extend into the headspace 213 above the liquid precursor 211 by an amount to serve as a splash guard. The use of both a splash guard (not shown) and the inside end 252 of the outlet conduit 250 extending into the headspace 213 above the liquid precursor 211 has been found to reduce precursor entrapment and liquid flush.

The valve cluster 230 includes a first inlet valve 261 in fluid communication with the inlet conduit 240. The first inlet valve 261 is located upstream of the ampoule 201 or ampoule lid 220 adjacent to the outside surface 222. The first inlet valve 261 can be placed as close to the outside surface 222 of the ampoule lid 120 as possible or can be spaced a distance from the outside surface 222.

The first inlet valve 261 can be any suitable valve that allows fluid communication between the upstream side of the valve and the downstream side of the valve. The first inlet valve 261 of some embodiments is a three-way valve that allows a flow of gas to pass from the upstream side of the valve to one or two downstream legs. For example, the first inlet valve 261 in the embodiments shown in FIGS. 1A-H is a three-way valve that allows the flow of gas to pass through the first inlet valve 261 to flow into the interior volume 216 of the ampoule 201 or to flow into the bypass conduit 280.

The first inlet valve 261 can be a manual valve which is operated by hand or can be a pneumatic valve that can be controlled electronically. In some embodiments, the first inlet valve 261 is a pneumatic valve.

A second inlet valve 266 in fluid communication with the inlet conduit 240. The second inlet valve 266 is located upstream of the first inlet valve 261. The second inlet valve 266 is spaced from the first inlet valve 261 along a length of the inlet conduit 240. The space between the first inlet valve 261 and the second inlet valve 266 can be any space and is not limited to short distances, e.g. less than 50 mm.

The second inlet valve 266 can be a manual valve which is operated by hand or a pneumatic valve which can be electronically controlled. In some embodiments, the second inlet valve 266 is a manual valve and the first inlet valve 261 is a pneumatic valve.

A first outlet valve 271 is in fluid communication with the outlet conduit 250. The first outlet valve 271 is located downstream of the ampoule lid 220. The first outlet valve 271 is located upstream of the ampoule lid 220 adjacent to the outside surface 222 of the ampoule lid 220. The first outlet valve 271 can be placed as close to the outside surface 222 of the ampoule lid 220 as possible or can be spaced a distance from the outside surface 222.

The first outlet valve 271 can be any suitable valve that allows fluid communication between the upstream side of the valve (i.e., nearer the ampoule) and the downstream side (i.e., further from the ampoule) of the first outlet valve 271. The first outlet valve 271 of some embodiments is a three-way valve that allows a flow of fluid to pass from the upstream side of the valve from one or two legs to the downstream side of the valve. For example, the first outlet valve 271 in the embodiments shown in FIGS. 1A-H is a three-way valve that allows the flow of fluid to pass through the first outlet valve 271 from the interior volume 216 of the ampoule 201 or from the bypass conduit 280, or from both.

The first outlet valve 271 can be a manual valve which is operated by hand or can be a pneumatic valve that can be controlled electronically. In some embodiments, the first outlet valve 271 is a pneumatic valve.

A second outlet valve 276 in fluid communication with the outlet conduit 250. The second outlet valve 276 is located downstream of the first outlet valve 271. The second outlet valve 276 is spaced from the first outlet valve 271 along a length of the outlet conduit 250. The space between the first outlet valve 271 and the second outlet valve 276 can be any space and is not limited to short distances such at 50 mm.

The second outlet valve 276 can be a manual valve which is operated by hand or a pneumatic valve which can be electronically controlled. In some embodiments, the second outlet valve 276 is a manual valve and the first outlet valve 271 is a pneumatic valve.

A bypass conduit 280 is coupled to and in fluid communication with the inlet conduit 240 and the outlet conduit 250. In the embodiments shown in FIGS. 1A-H, the bypass conduit 280 and the bypass valve are coupled to the first inlet valve 261 and the first outlet valve 271, and in the embodiments shown in FIGS. 1A-E, the bypass conduit 280 and the bypass valve are coupled to the second inlet valve 266 and the second outlet valve 276. In the flow path, the first inlet valve 261 can be a three-way valve that allows the flow of fluid to pass through the first inlet valve 261 from the upstream side (i.e., further from the interior volume 216) to the interior volume 216 or to the bypass conduit 280, or a combination of both. The fluid flowing through the bypass conduit 280 can pass through the first outlet valve 271 which is a three-way valve that allows fluid from the bypass conduit 280, the interior volume 216 of the ampoule 201, or both to pass through.

In some embodiments, the bypass conduit 280 includes a bypass valve 281 in fluid communication with the bypass conduit 280. The bypass valve 281 can be a manual valve which is operated by hand or a pneumatic valve which can be electronically controlled. In some embodiments, the bypass valve 281 is a pneumatic valve. In one or more embodiments, the first inlet valve 261, the first outlet valve 271 and the bypass valve 281 are pneumatic valves.

In use, the gas supply 279 supplies a carrier gas (e.g., Ar), which flows into the inlet conduit 240 through the outside end 241. The gas passes through the second inlet valve 266 from an upstream side of the valve to the downstream side of the valve. The gas passes through the first inlet valve 261 from an upstream side of the valve to the downstream side of the valve. The gas then passes into the interior volume 216 of the ampoule through the sparger 247. In the interior volume 216, the gas disturbs the liquid precursor 211 and carries precursor molecules to inside end 252 of the outlet conduit 250. In one or more embodiments, the precursor molecules are in vapor form. The carrier gas including the precursor flows through the first outlet valve 271 and the second outlet valve 276 toward, for example, the processing chamber 283. Once the process has been completed, the first inlet valve 261 and first outlet valve 271 can be closed, or diverted to allow flow through the bypass conduit 280. The bypass valve 281 can be opened allowing the carrier gas, or purge gas, to flow through the second inlet valve 266 and the first inlet valve 261 before passing through the bypass valve 281 and bypass conduit 280. The purge gas then flows through the first outlet valve 271 and the second outlet valve 276 of the outlet conduit 250 removing all residue of the precursor that may remain in the outlet conduit 250.

Figure 1B:
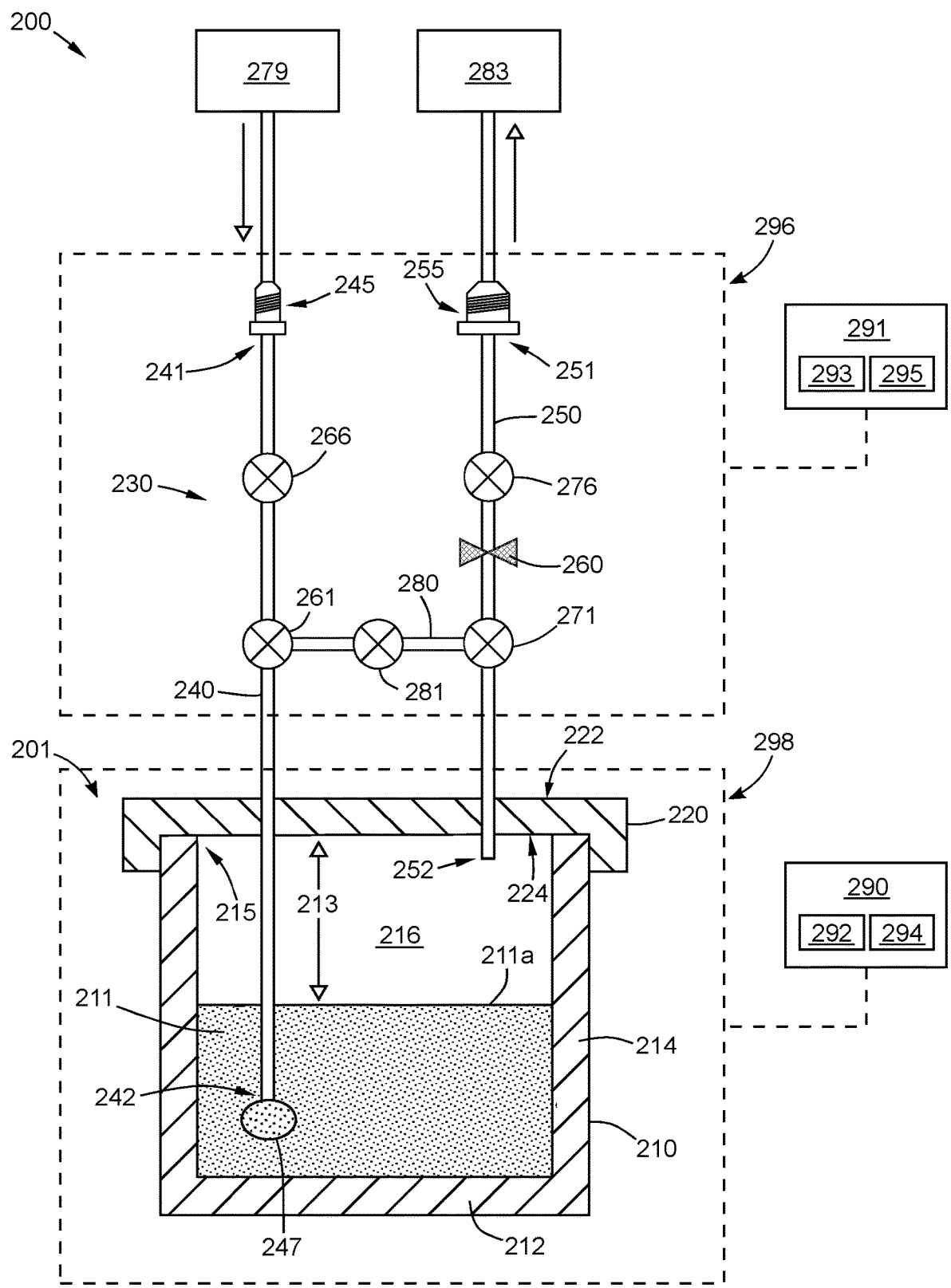
FIG. 1B shows a schematic of an apparatus in accordance with one or more embodiments of the disclosure.
Figure 1C:
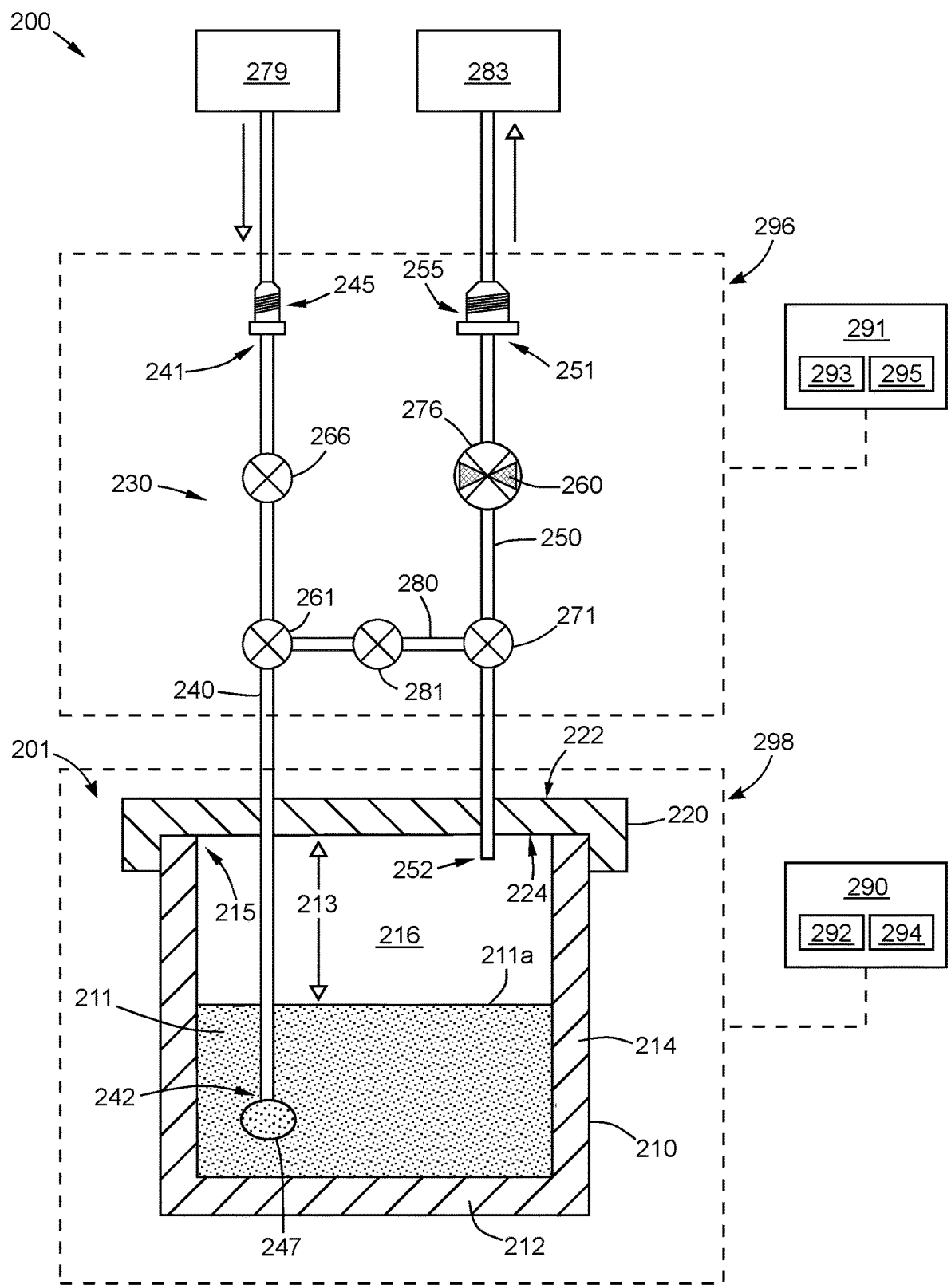
FIG. 1C shows a schematic of an apparatus in accordance with one or more embodiments of the disclosure.
Figure 1D:
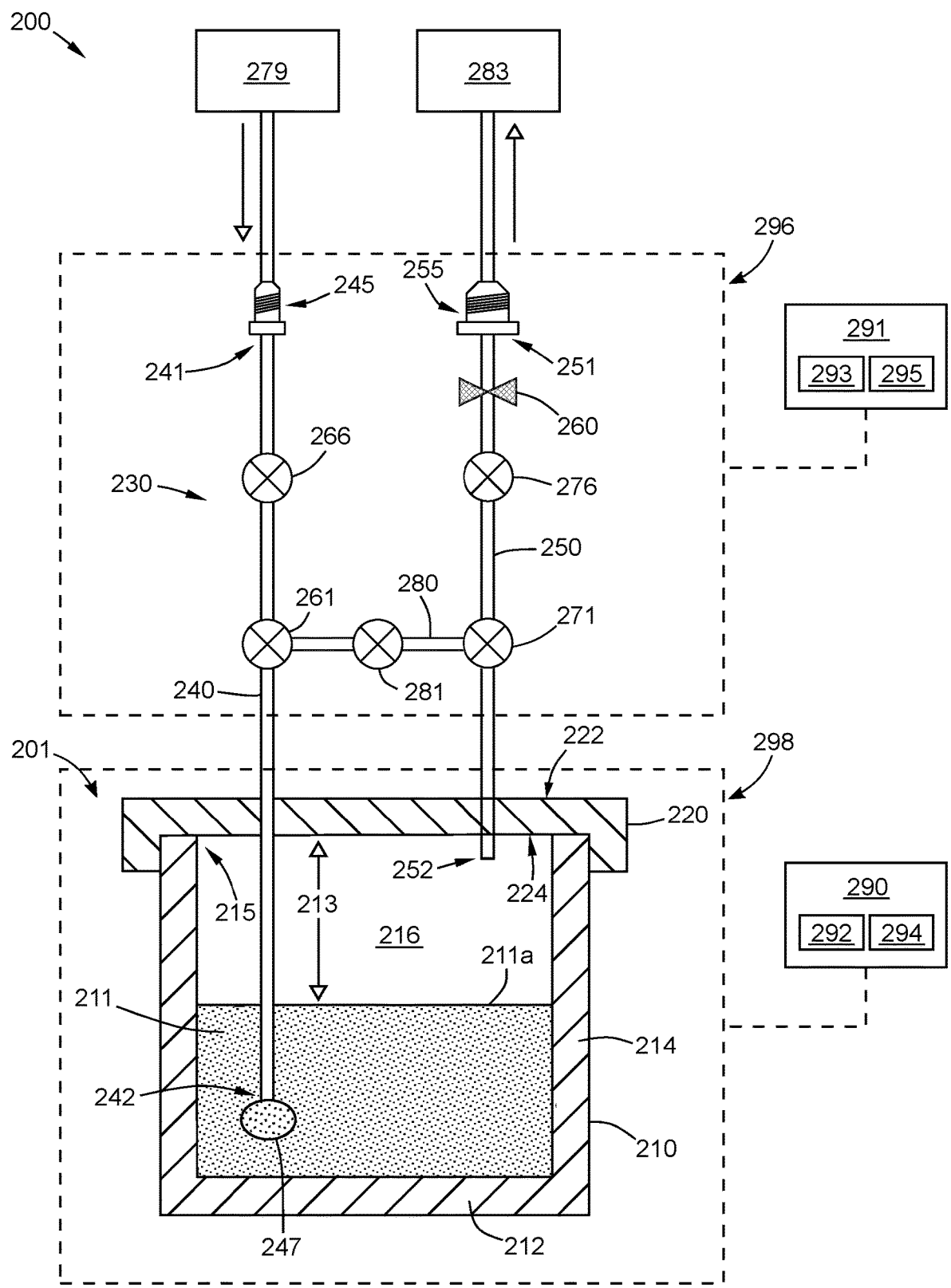
FIG. 1D shows a schematic of an apparatus in accordance with one or more embodiments of the disclosure.
Figure 1E:
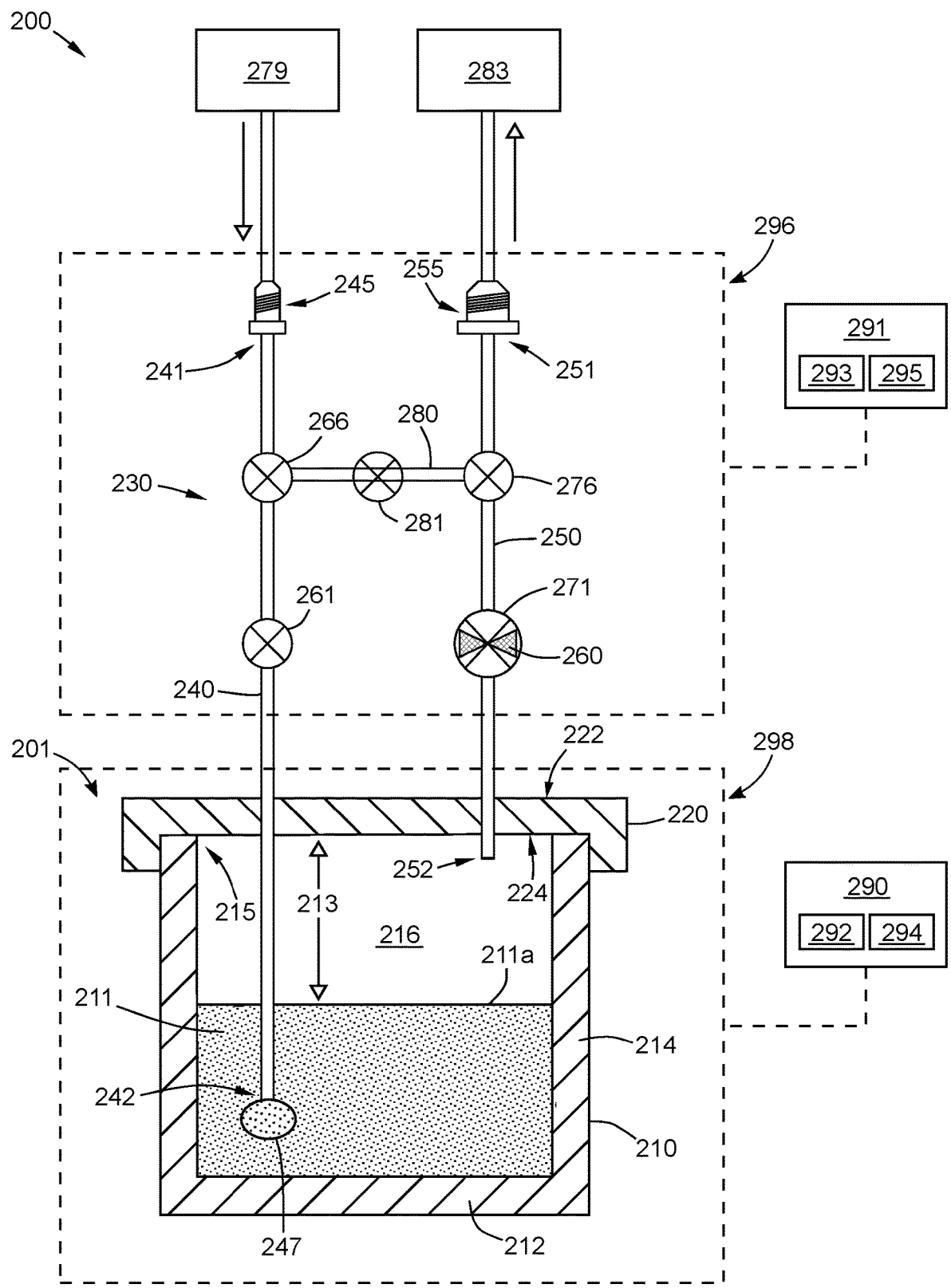
FIG. 1E shows a schematic of an apparatus in accordance with one or more embodiments of the disclosure.
Figure 1F:
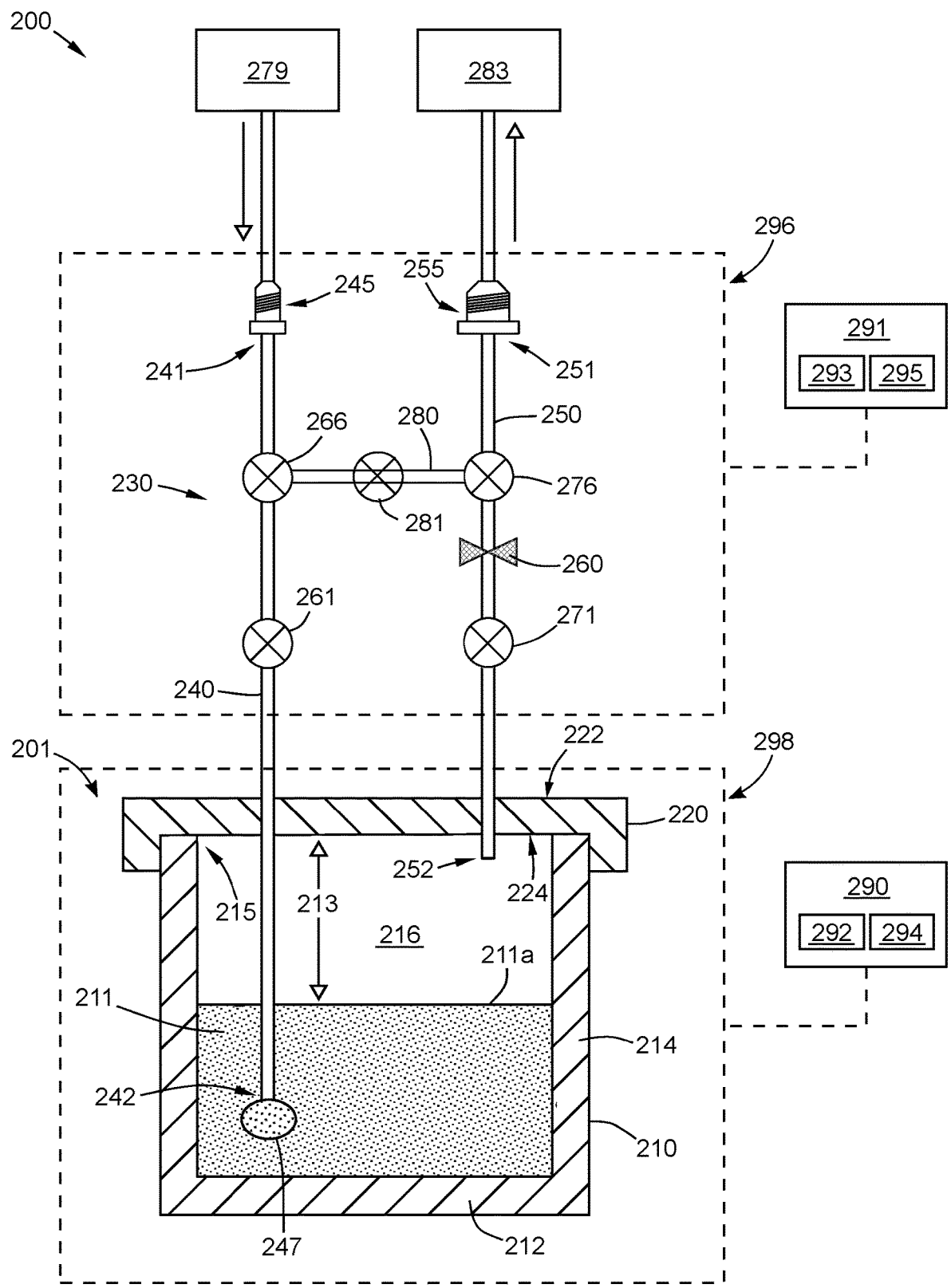
FIG. 1F shows a schematic of an apparatus in accordance with one or more embodiments of the disclosure.
Figure 1G:
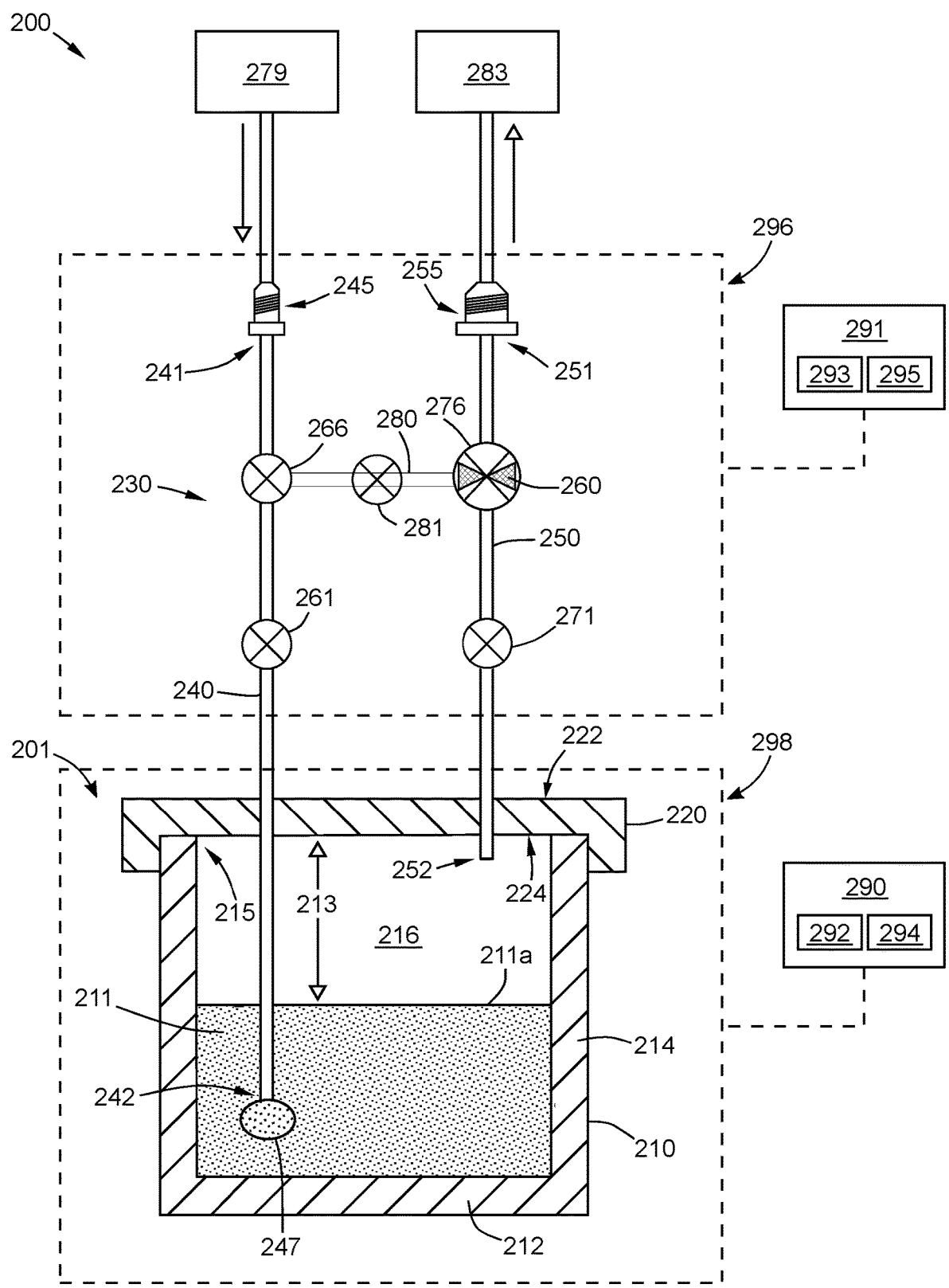
FIG. 1G shows a schematic of an apparatus in accordance with one or more embodiments of the disclosure.
Figure 1H:
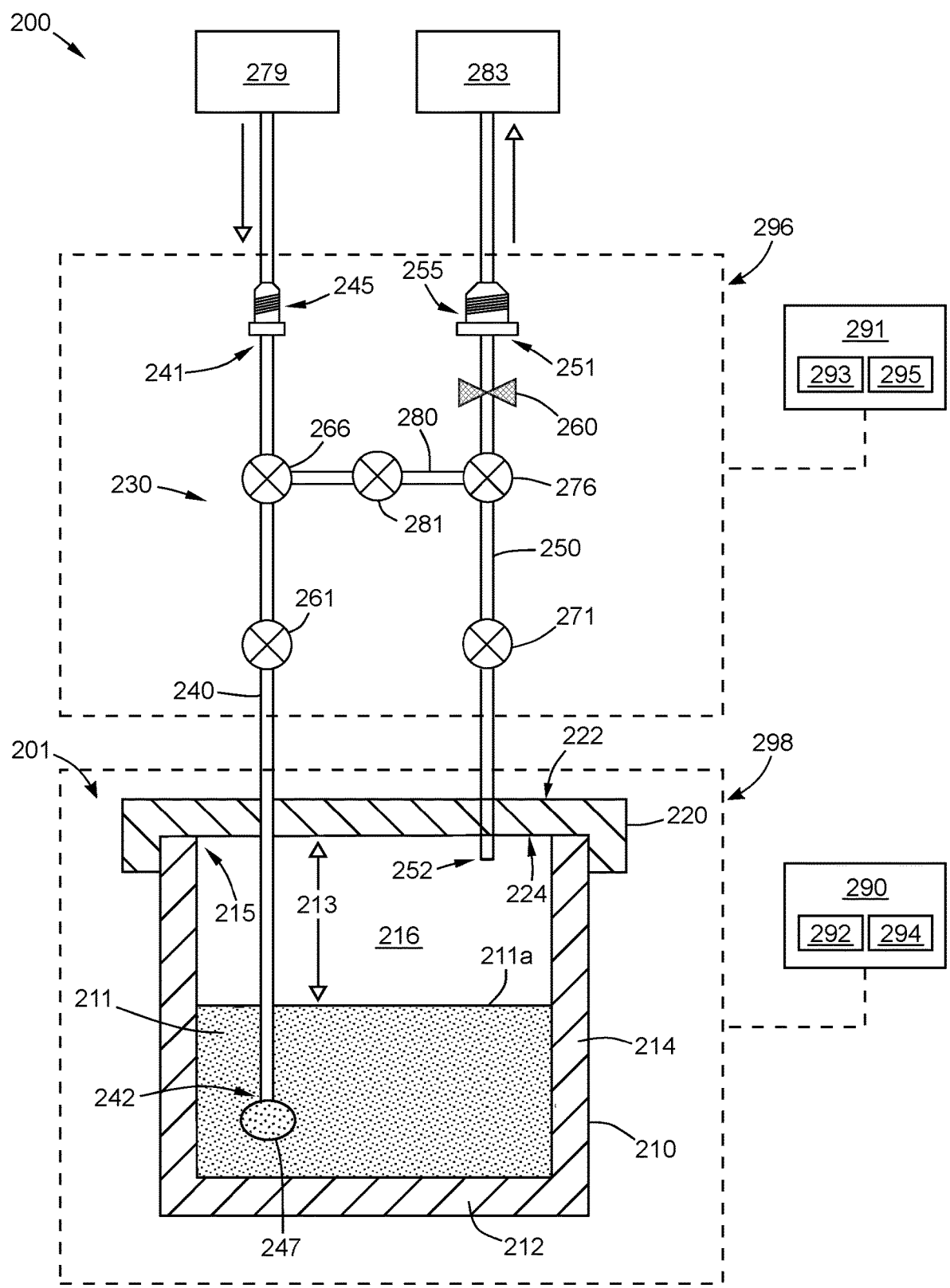
FIG. 1H shows a schematic of an apparatus in accordance with one or more embodiments of the disclosure.

In the embodiments shown in FIGS. 1A-H, there is an auxiliary flow restrictive device 260 connected to the outlet conduit 250. It will be understood that an auxiliary flow restrictive device could be connected to the outlet conduit at any point along the length between the ampoule lid 220 and the outside end. Thus, the location of the auxiliary flow restrictive device is not limited to the locations shown in FIGS. 1A-H. The flow restrictive device 260 could be upstream or before the first outlet valve 271 or downstream from the second outlet valve 276. In some embodiments, the auxiliary flow restrictive device 260 is directly connected to at least one of the first outlet valve 271 and the second outlet valve 276. According to one or more embodiments, directly connected means that the auxiliary flow restrictive device 260 is embedded or otherwise fastened to the first outlet valve 271 and or second outlet valve 276 without any intervening conduit or spacing between the auxiliary flow restrictive device 260 and the respective valve. In one or more embodiments, the auxiliary flow restrictive device 260 is configured to variably regulate a drop in pressure from the inlet conduit 240 to the outlet conduit 250. In FIGS. 1A and 1E, the auxiliary flow restrictive device 260 is connected to or directly coupled to the first outlet valve 271 to provide precise flow control of the flow through the first outlet valve 271 and to precisely regulate and control the drop in pressure (or pressure drop) from the inlet conduit 240 to the outlet conduit 250. FIGS. 1B and 1F show configurations in which the auxiliary flow restrictive device 260 is connected to the outlet conduit 250 between the first outlet valve and the second outlet valve 276. FIGS. 1C and 1G show configurations in which the auxiliary flow restrictive device 260 is directly connected to or directly coupled to the second outlet valve 276 to provide precise flow control of the flow through the second outlet valve 276 and to precisely regulate and control the drop in pressure (or pressure drop) from the inlet conduit 240 to the outlet conduit 250. FIGS. 1D and 1H show configurations in which the auxiliary flow restrictive device 260 is connected to the outlet conduit 250 downstream from the second outlet valve and between the second outlet valve 276 and the processing chamber 283.

When the bypass conduit 280 and bypass valve 281 are connected between the first inlet valve 261 and the first outlet valve 271, the residual precursor inside the precursor delivery path from the first outlet valve 271 to the second outlet valve 276 can be purged away quickly. It has been found that fast removal of the residual precursor from the delivery conduit reduces the particle formation.

It was discovered that precise control of the flow at the outlet conduit 250 provided precise concentration control of the precursor from the apparatus 200. An apparatus 200 having the arrangement shown in FIGS. 1B and 1F, where a restrictive flow orifice was placed between the first outlet valve 271 and the second outlet valve, and compared to a result in which the restrictive flow orifice was placed between the first inlet valve 261 and the second inlet valve 266, with no restrictive flow orifice (RFO) on the outlet conduit 250. The settings of the first inlet valve 261, the second inlet valve 266, the first outlet valve 271, the second outlet valve 276 and the bypass valve 281 were the same for both setups. Several different sized restrictive flow orifices were tested on the inlet conduit 240 and the outlet conduit 250. Pressure drop in Torr and precursor concentration were measured at the inlet and the outlet. Table 1 shows the results.

TABLE 1

| Nominal RFO Size | Pressure Drop (Torr) | | Concentration | | Pressure Drop (Torr) | | % Change Concentration | |
|---|---|---|---|---|---|---|---|---|
| (mm) | Inlet | Outlet | Inlet | Outlet | Inlet | Outlet | Inlet | Outlet |
| No RFO | 30.50 ± 0.015 | 30.50 ± 0.015 | 0.659 ± 0.011 | 0.659 ± 0.011 | 0.00 | 0.00 | 0.0 | 0.0 |
| 2.1 | 32.15 ± 0.004 | 32.15 ± 0.004 | 0.629 ± 0.009 | 0.559 ± 0.008 | 1.64 | 2.20 | −4.6 | −15.1 |
| 2.0 | 32.50 ± 0.153 | 32.50 ± 0.153 | 0.651 ± 0.004 | 0.556 ± 0.008 | 2.00 | 2.97 | −1.3 | −15.6 |
| 1.65 | 35.34 ± 0.012 | 35.34 ± 0.012 | 0.622 ± 0.013 | 0.502 ± 0.007 | 4.84 | 5.40 | −5.5 | −23.8 |
| 1.5 | 39.41 ± 0.011 | 39.41 ± 0.011 | 0.622 ± 0.010 | 0.426 ± 0.004 | 8.91 | 9.92 | −5.7 | −35.3 |
| 1.3 | 45.13 ± 0.016 | 45.13 ± 0.016 | 0.609 ± 0.007 | 0.358 ± 0.004 | 14.62 | 16.49 | −7.5 | −45.7 |

Figure 2:
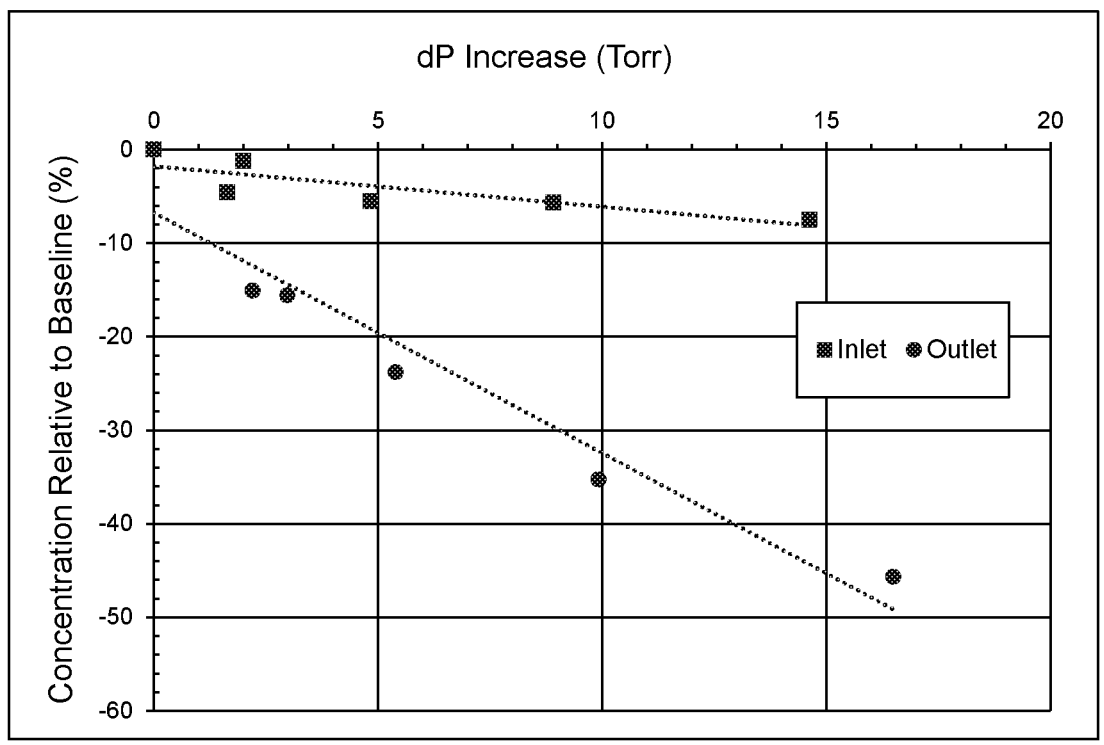
FIG. 2 is a graph showing concentration of a precursor versus pressure drop according to one or more embodiments.
Figure 3:
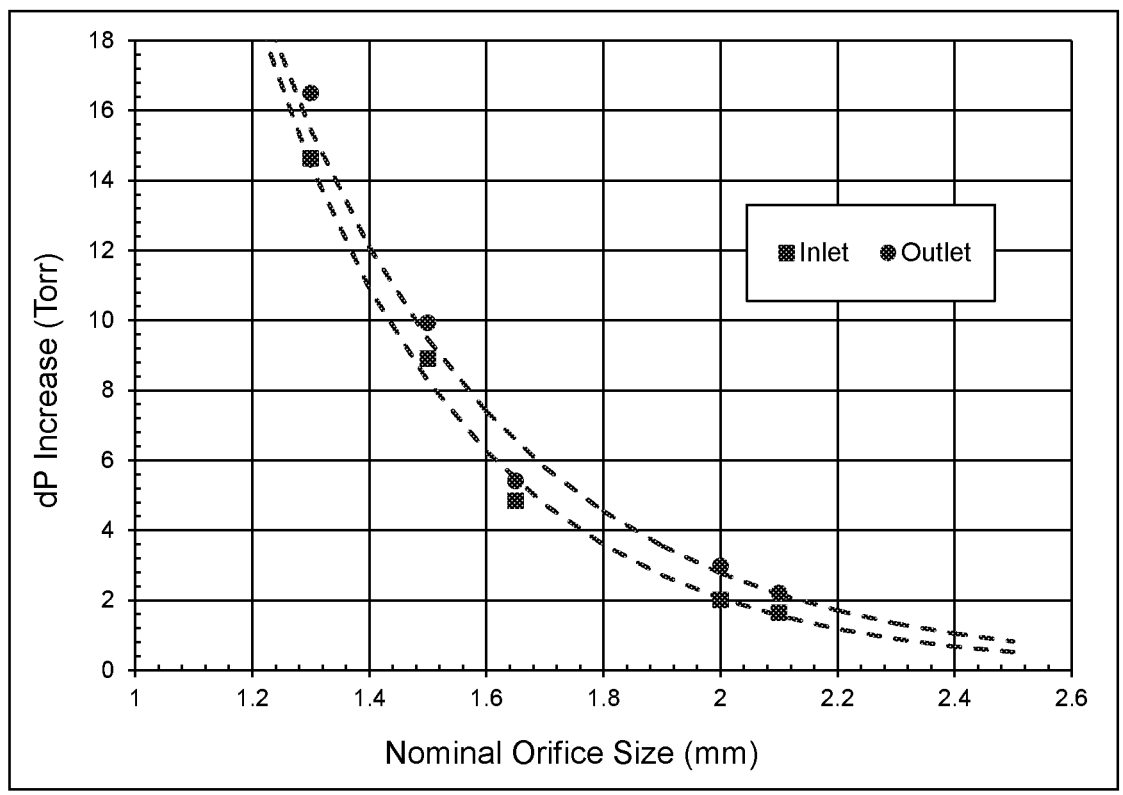
FIG. 3 is a graph showing orifice size versus pressure drop according to one or more embodiments.

The results are also plotted in FIG. 3, which is a graph of pressure drop versus nominal orifice size. FIG. 3 shows a plot of pressure drop for the inlet and outlet versus concentration of the precursor relative to the baseline percentage before the restrictive flow orifice (RFO). As can be seen from FIG. 3, the pressure drop at the inlet and the outlet match relatively closely. However, as shown in FIG. 2, the increase in pressure drop at the outlet conduit 250 leads to a much lower concentration versus a similar pressure drop at the inlet conduit. Accordingly, it was determined that by precisely controlling pressure drop at the outlet conduit 250 of the valve cluster 230, better concentration control can be obtained the vapor exiting the ampoule 201 and entering the processing chamber 283. The more precise concentration control will reduce concentration variability of the precursor vapor exiting the ampoule 201 and entering the processing chamber, enabling for a more precisely controlled film formation process.

Figure 4:
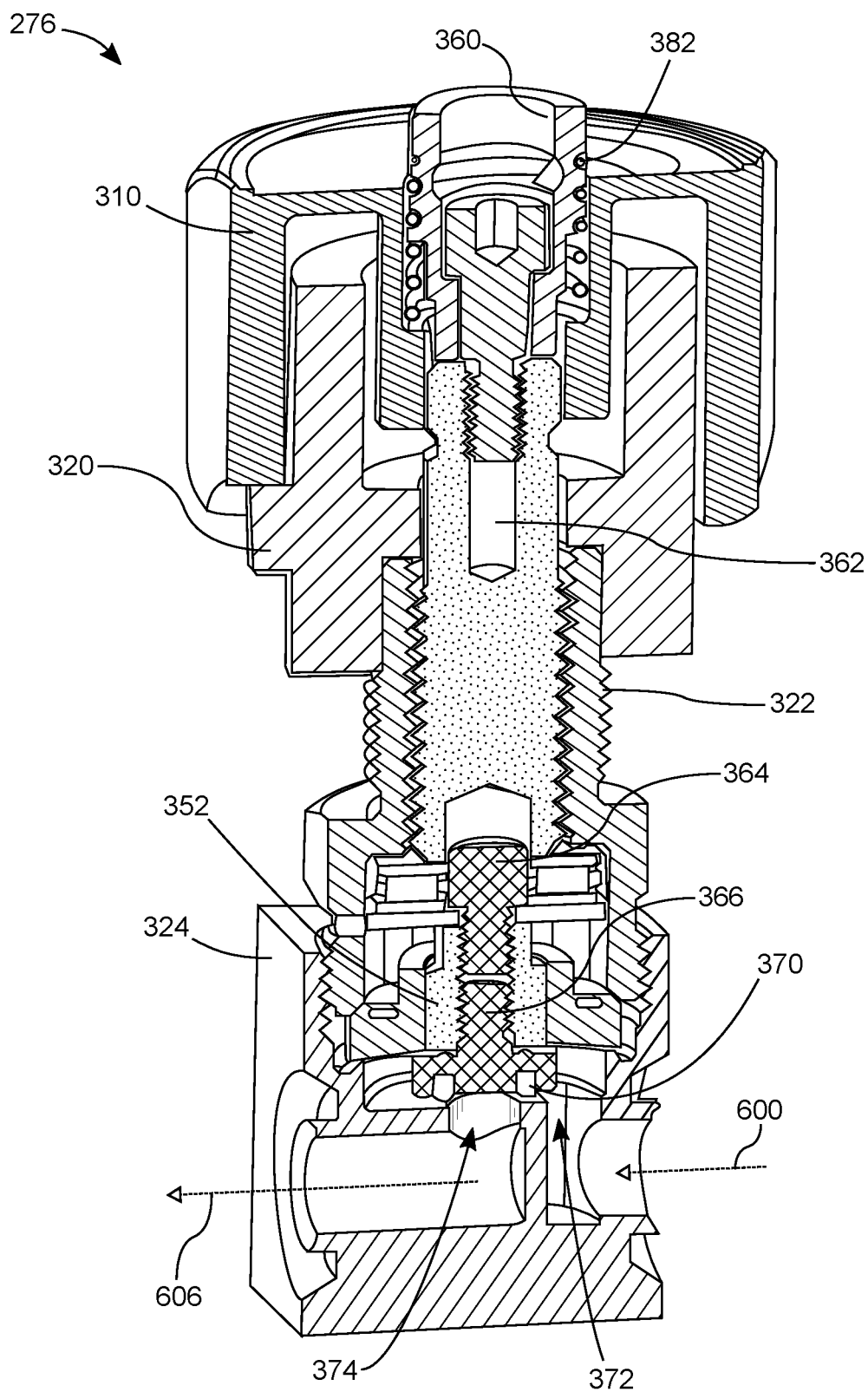
FIG. 4 is a perspective cross-sectional view of a valve according to one or more embodiments.
Figure 5:
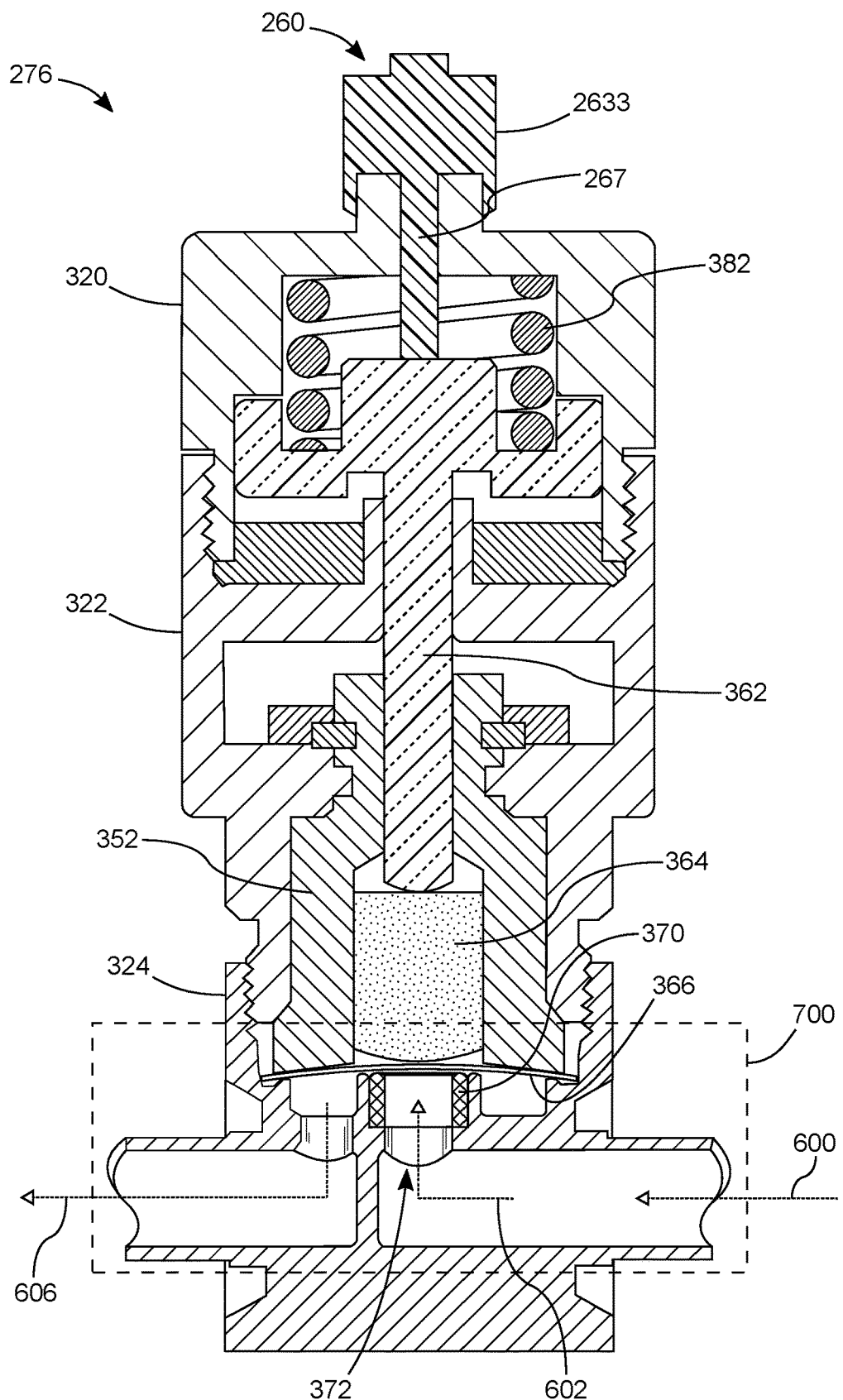
FIG. 5 is a cross-sectional view of a valve according to one or more embodiments including an auxiliary flow restriction device.
Figure 6:
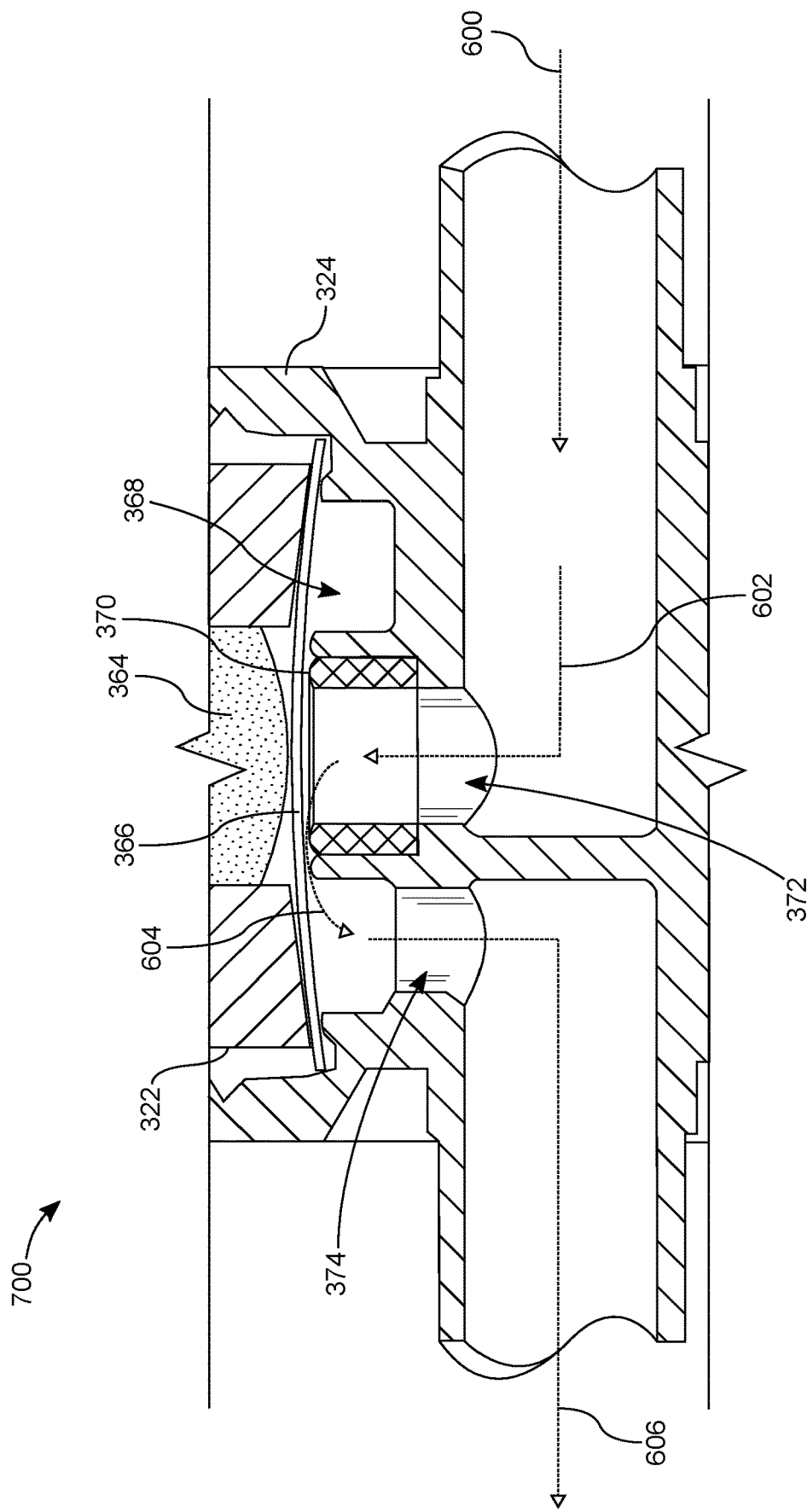
FIG. 6 is an enlarged cross-sectional view of a valve according to one or more embodiments of the disclosure.

FIGS. 4-6 show views of the second outlet valve 276 according to one or more embodiments of the disclosure. It will be understood that the first inlet valve 261, the second inlet valve 266, the first outlet valve 271 and/or the bypass valve 281 could have a similar configuration to the second outlet valve 276 shown in FIGS. 4-6.

In the embodiment shown in FIGS. 4-6, the second outlet valve 276 comprises an upper valve body 320, an intermediate valve body 322, and a lower valve body 324 to form the body of the valve. The upper valve body 320 is connected to the intermediate valve body 322, and the intermediate valve body 322 is connected to lower valve body 324. Valve control 360, for example, a knob 310, handle or a pneumatic controller, controls movement of a piston 364 within the valve to regulate fluid flow through the valve. The piston 364 is connected to the valve control 360 by a valve stem 362. The valve control 360 can be adjusted to move the piston 364 in a downward direction through a bonnet 352 within the valve to cause the diaphragm 366 to close against a valve seat 370 (See FIG. 6). The valve control 360 is configured to close and open the diaphragm 366 supported within the valve by diaphragm support 368. The second outlet valve 276 further comprises a spring 382 that provides a biasing force with respect to the knob 310.

The lower valve body 324 comprises an inlet port 600 allowing fluid to flow into the valve in direction of arrow 602 through first valve conduit 372 to allow fluid to flow between the diaphragm 366 and the valve seat 370 and out second valve conduit 374 as shown by arrow 602 and through an outlet port 606.

Referring now to FIG. 5, the second outlet valve further comprises an auxiliary flow restriction device 260 configured to variably regulate a concentration of the precursor flowing out of the outlet conduit and to the process chamber. In the embodiment shown in FIG. 5, the auxiliary flow restriction device is mounted to the second outlet valve 276 to provide more precise control of downward and upward movement of the valve stem 362, which moves the piston to open and close the diaphragm 366 on the valve seat 370. In some embodiments, the auxiliary flow restrictive device 260 comprises a manual valve, for example, a manual fine metering valve comprising a stem 267 and a Vernier handle 263, and the manual fine metering valve is configured to regulate flow of gas through the valve with greater precision than the knob 310. A fine metering valve with Vernier handle 263 in some embodiments provides fine control to regulate gas flow. The Vernier handle 263 handle attaches to the stem 267 and is more comfortable to turn than the stem 267 alone. The thicker body of the Vernier handle 263 also allows for more precise control than possible by turning the stem 267. Additionally, The Vernier handle 263 in some embodiments may include a scale (not shown) on the handle that can be used for visual detection of movement. In other embodiments, auxiliary flow restrictive device 260 comprises a motor controlled valve. Examples of motor controlled valves comprise motor controlled actuator valves, for example, a piezoelectric controlled linear actuator.

In FIG. 5, the auxiliary flow restrictive device 260 is shown mounted adjacent the knob 310. In other embodiments, the auxiliary flow restrictive device 260 is mounted adjacent to or to the outlet port 606 of the valve, which the ability variably regulate a concentration of the precursor flowing out of the outlet conduit and to the process chamber and provide precise concentration control over delivery of the precursor to the processing chamber 283.

Referring back to FIGS. 1A-H, the apparatus 200 according to one or more embodiments can comprise a first controller 291. The first controller 291 according to one or more embodiments comprises a first processor 293, a first memory 295 coupled to the processor, input/output devices coupled to the first processor 293, and support circuits to provide communication between the different components of the system or apparatus, operation of the valve cluster 230 and flow of gas to the processing chamber 283. Additionally, the valve cluster 230 may be enclosed by a first heated enclosure 296 to heat the valve cluster 230 during a film forming operation. The first controller 291, the first processor 293 and the first memory 295 may also control heating and cooling of the first heated enclosure 296. Processes to operate the system or apparatus 200 may generally be stored in the memory as a software routine that, when executed by the processor, causes the system or apparatus 200 to perform methods described in the present disclosure. The software routine may also be stored and/or executed by a second processor (not shown) that is remotely located from the hardware being controlled by the processor. Some or all of the methods of the present disclosure may also be performed in hardware. As such, the methods described in this disclosure are implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The apparatus 200 according to one or more embodiments can comprise a second controller 290. The second controller 290 according to one or more embodiments comprises a second processor 292, a second memory 294 coupled to the processor, input/output devices coupled to the second processor 292, and support circuits to provide communication between the different components of the system or apparatus, operation of a second heated enclosure 298 surrounding the ampoule 201 and flow of gas from the gas supply 279 to the ampoule 201 and to the processing chamber 283. The second controller 290, the second processor 292 and the second memory 294 may also control heating and cooling of the second heated enclosure 298. Processes to operate the system or apparatus 200 may generally be stored in the memory as a software routine that, when executed by the processor, causes the system or apparatus 200 to perform methods described in the present disclosure. The software routine may also be stored and/or executed by a second processor (not shown) that is remotely located from the hardware being controlled by the processor. Some or all of the methods of the present disclosure may also be performed in hardware. As such, the methods described in this disclosure are implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The first memory 295 and the second memory 294 of one or more embodiments includes one or more of transitory memory (e.g., random access memory) and non-transitory memory (e.g., storage) and the memory of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

In one or more embodiments, the first controller 291 and the second controller 290 execute instructions deliver precursor from the ampoule 201 to the processing chamber 283. In some embodiments, the first controller 291 controls operation of the motor controlled linear actuator such as the piezoelectric linear controlled actuator to precisely regulate concentration of the precursor flowed from the ampoule 201 to the process chamber 283.

Embodiments of the disclosure further pertain to method of delivering a precursor to a substrate processing chamber. In one or more embodiments, a method comprises flowing a carrier gas through the ampoule 201 having an interior volume 216 containing a liquid precursor 211 defining a liquid level surface 211a, the carrier gas flowing through a valve cluster. The valve cluster includes an inlet conduit 240 connected to the ampoule 201 and configured to allow gas to flow into the ampoule 201, the inlet conduit 240 including a first inlet valve 261 connected to the inlet conduit and a second inlet valve 266 connected to the inlet conduit and upstream of the first inlet valve 261. The valve cluster further includes an outlet conduit 250 connected to the ampoule and configured to allow the carrier gas and a precursor vapor to flow out of the ampoule 201, the outlet conduit 250 including a first outlet valve 271 connected to the outlet conduit 250 and a second outlet valve 276 connected to the outlet conduit 250 and downstream of the first outlet valve 271. The valve cluster further includes a bypass conduit 280 including a bypass valve 281 disposed between the inlet conduit 240 and the outlet conduit 250. In some embodiments, the second outlet valve comprises a piston and a diaphragm which regulate the flow of gas through the second outlet valve 276 as described above. In other embodiments, any of the first inlet valve, second inlet valve 266, bypass valve 281 and/or first inlet valve 261 can also comprise a piston and diaphragm which regulate the flow of gas.

The method of some embodiments further comprises restricting the flow through the outlet conduit with an auxiliary flow restrictive device 260. In some method embodiments, restricting the flow through the outlet conduit controls a concentration of the precursor vapor flowing to the processing chamber. Some embodiments comprise restricting the flow through the second outlet valve with a manual valve. In some embodiments, the manual valve comprises a Vernier handle. Some embodiments comprise restricting the flow through the second outlet valve with a motor controlled valve. In some embodiments of the method, the motor controlled valve comprises a piezoelectric controlled linear actuator. Some method embodiments include controlling the motor controlled valve with a controller which controls operation of the piezoelectric linear controlled actuator.

One or more embodiments provide apparatus and methods comprising an auxiliary flow restrictive device that restricts flow through the outlet conduit, tuning the ampoule headspace pressure and delivered concentration from the ampoule. Variability in the ampoule headspace pressure is reduced, consequently reducing variability in the concentration of precursor vapors delivered from the ampoule to the processing chamber. The apparatus and methods according to embodiments provide improved concentration control of precursors delivered to processing chambers compared to apparatus and methods that do not utilize an auxiliary flow restrictive device that provides fine metering and/or precise control of flow through the outlet conduit to a processing chamber.

While the foregoing is directed to embodiments of the present invention, other and further embodiments of the disclosure may be devised without departing from the basic scope thereof, and the scope thereof is determined by the claims that follow.

What is claimed is:

1. An apparatus comprising:
an ampoule having an outside surface and an inside surface defining an ampoule interior configured to contain a fluid therein;
a valve cluster connected to the outside surface of the ampoule, the valve cluster including:
an inlet conduit connected to the ampoule and configured to allow gas to flow into the ampoule;
an outlet conduit connected to the ampoule and configured to allow gas to flow out of the ampoule;
a first inlet valve connected to the inlet conduit;
a second inlet valve connected to the inlet conduit and upstream of the first inlet valve;
a first outlet valve connected to the outlet conduit;
a second outlet valve connected to the outlet conduit and downstream of the first outlet valve; and
a bypass conduit including a bypass valve disposed between the inlet conduit and the outlet conduit; and
an auxiliary flow restrictive valve directly connected to at least one of the first outlet valve and the second outlet valve without any intervening conduit or spacing between the auxiliary flow restrictive valve and the first outlet valve and the second outlet valve, the auxiliary flow restrictive valve configured to variably regulate a drop in pressure from the inlet conduit to the outlet conduit.

2. The apparatus of claim 1, wherein the bypass conduit and the bypass valve are connected to and disposed between the second inlet valve and the second outlet valve, the apparatus further comprising a first heated enclosure enclosing the valve cluster and a first controller configured to control operation of the valve cluster, the flow of precursor vapor from the ampoule and heating and cooling of the first heated enclosure; and a second heated enclosure surrounding the ampoule and a second controller configured to control heating and cooling of the second heated enclosure.

3. The apparatus of claim 1, wherein the auxiliary flow restrictive valve is directly connected to the first outlet valve.

4. The apparatus of claim 1, wherein the second outlet valve comprises a diaphragm and a valve seat.

5. The apparatus of claim 4, wherein the auxiliary flow restrictive valve comprises a manual valve.

6. The apparatus of claim 5, wherein the manual valve comprises a Vernier handle, and the manual valve is configured to regulate flow of gas through the manual valve.

7. The apparatus of claim 1, the auxiliary flow restrictive valve comprises a motor-controlled valve.

8. The apparatus of claim 7, wherein the motor-controlled valve comprises a piezoelectric controlled linear actuator.

9. The apparatus of claim 8, the apparatus further comprising a controller which controls operation of the piezoelectric linear controlled actuator.

10. The apparatus of claim 8, wherein the piezoelectric controlled linear actuator is directly connected to the second outlet valve.

11. The apparatus of claim 1, wherein the ampoule comprises an ampoule lid having an inner surface and a first end of the inlet conduit is connected to a gas source and a second end of the inlet conduit extends into the interior of the ampoule a first distance from the inner surface of the ampoule lid.

12. The apparatus of claim 11, wherein a first end of the outlet conduit is in fluid communication with a substrate processing chamber and a second end of the outlet conduit is in flow communication with the interior of the ampoule and the second end of the outlet conduit extends a second distance from the inner surface of the ampoule lid, the second distance being less than the first distance.

13. An apparatus comprising:
an ampoule having an outside surface and an inside surface defining an ampoule interior configured to contain a fluid therein;
a valve cluster connected to the outside surface of the ampoule, the valve cluster configured to regulate the flow of a precursor vapor from the ampoule to a process chamber, the valve cluster including:
an inlet conduit connected to the ampoule and configured to allow gas to flow into the ampoule;
an outlet conduit connected to the ampoule and configured to allow gas to flow out of the ampoule and to the process chamber;
a first inlet valve connected to the inlet conduit;
a second inlet valve connected to the inlet conduit and upstream of the first inlet valve;
a first outlet valve connected to the outlet conduit;
a second outlet valve connected to the outlet conduit and downstream of the first outlet valve comprising a piston and a diaphragm which regulate the flow of gas through the second outlet valve; and
a bypass conduit including a bypass valve disposed between the inlet conduit and the outlet conduit;
an auxiliary flow restrictive valve directly connected to at least one of the first outlet valve and the second outlet valve without any intervening conduit or spacing between the auxiliary flow restrictive valve and the first outlet valve and the second outlet valve, the auxiliary flow restrictive valve configured to variably regulate a concentration of the precursor flowing out of the outlet conduit and to the process chamber;
a first heated enclosure enclosing the valve cluster and a first controller configured to control operation of the valve cluster, the flow of precursor vapor to the process chamber and heating and cooling of the first heated enclosure; and
a second heated enclosure surrounding the ampoule and a second controller configured to control heating and cooling of the second heated enclosure.

14. A method of delivering a precursor to a substrate process chamber, the method comprising:
flowing a carrier gas through the apparatus of claim 1, and;
restricting the flow through the outlet conduit with the auxiliary flow restrictive valve.

15. The method of claim 14, wherein restricting the flow through the outlet conduit controls a concentration of the precursor vapor flowing to the process chamber.

16. The method of claim 15, further comprising restricting the flow through the second outlet valve with a manual valve.

17. The method of claim 16, wherein the manual valve comprises a Vernier handle.

18. The method of claim 15, further comprising restricting the flow through the second outlet valve with a motor-controlled valve.

19. The method of claim 18, wherein the motor-controlled valve comprises a piezoelectric controlled linear actuator.

20. The method of claim 19, further comprising controlling the motor-controlled valve with a controller which controls operation of the piezoelectric linear controlled actuator.

* * * * *